(12) United States Patent
Abbott

(10) Patent No.: US 6,376,901 B1
(45) Date of Patent: Apr. 23, 2002

(54) PALLADIUM-SPOT LEADFRAMES FOR SOLDER PLATED SEMICONDUCTOR DEVICES AND METHOD OF FABRICATION

(75) Inventor: Donald C. Abbott, Norton, MA (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/589,051

(22) Filed: Jun. 6, 2000

Related U.S. Application Data

(60) Provisional application No. 60/138,070, filed on Jun. 8, 1999.

(51) Int. Cl.$^7$ ............................................. H01L 23/495
(52) U.S. Cl. ...................... 257/666; 257/672; 257/674; 257/677
(58) Field of Search ................................ 257/666, 674, 257/677, 672; 438/123; 361/813

(56) References Cited

U.S. PATENT DOCUMENTS

| | | | | |
|---|---|---|---|---|
| 5,635,755 A | * | 6/1997 | Kinghorn | 257/666 |
| 5,728,285 A | * | 3/1998 | Mathew | 205/182 |
| 5,767,574 A | * | 6/1998 | Kim et al. | 257/677 |
| 5,914,532 A | * | 6/1999 | Akagi et al. | 257/677 |
| 6,034,422 A | * | 3/2000 | Horita et al. | 257/666 |
| 6,087,712 A | * | 7/2000 | Kim et al. | 257/666 |
| 6,087,714 A | * | 7/2000 | Kubara et al. | 257/666 |
| 6,245,448 B1 | * | 6/2001 | Abbott | 428/670 |
| 6,287,896 B1 | * | 9/2001 | Yeh et al. | 438/123 |

FOREIGN PATENT DOCUMENTS

| | | | |
|---|---|---|---|
| JP | 3-237750 | * | 10/1991 |
| JP | 7-326701 | * | 12/1995 |
| JP | 9-172121 | * | 6/1997 |
| JP | 9-307050 | * | 11/1997 |
| JP | 10-41452 | * | 2/1998 |
| JP | 10-289973 | * | 10/1998 |
| JP | 11-111909 | * | 11/1999 |
| JP | 2000-77593 | * | 3/2000 |

* cited by examiner

*Primary Examiner*—Jhihan B. Clark
(74) *Attorney, Agent, or Firm*—Gary C. Honeycutt; Fred Telecky; Arthur I. Navarro

(57) ABSTRACT

A leadframe for use with integrated circuit chips Comprising a base metal having a plated layer of nickel fully covering said base metal; a plated layer of palladium on said nickel layer, selectively covering areas of said leadframe intended for bonding wire attachment; and a plated layer of solder on said nickel layer, selectively covering areas of said leadframe intended for parts attachment.

16 Claims, 4 Drawing Sheets

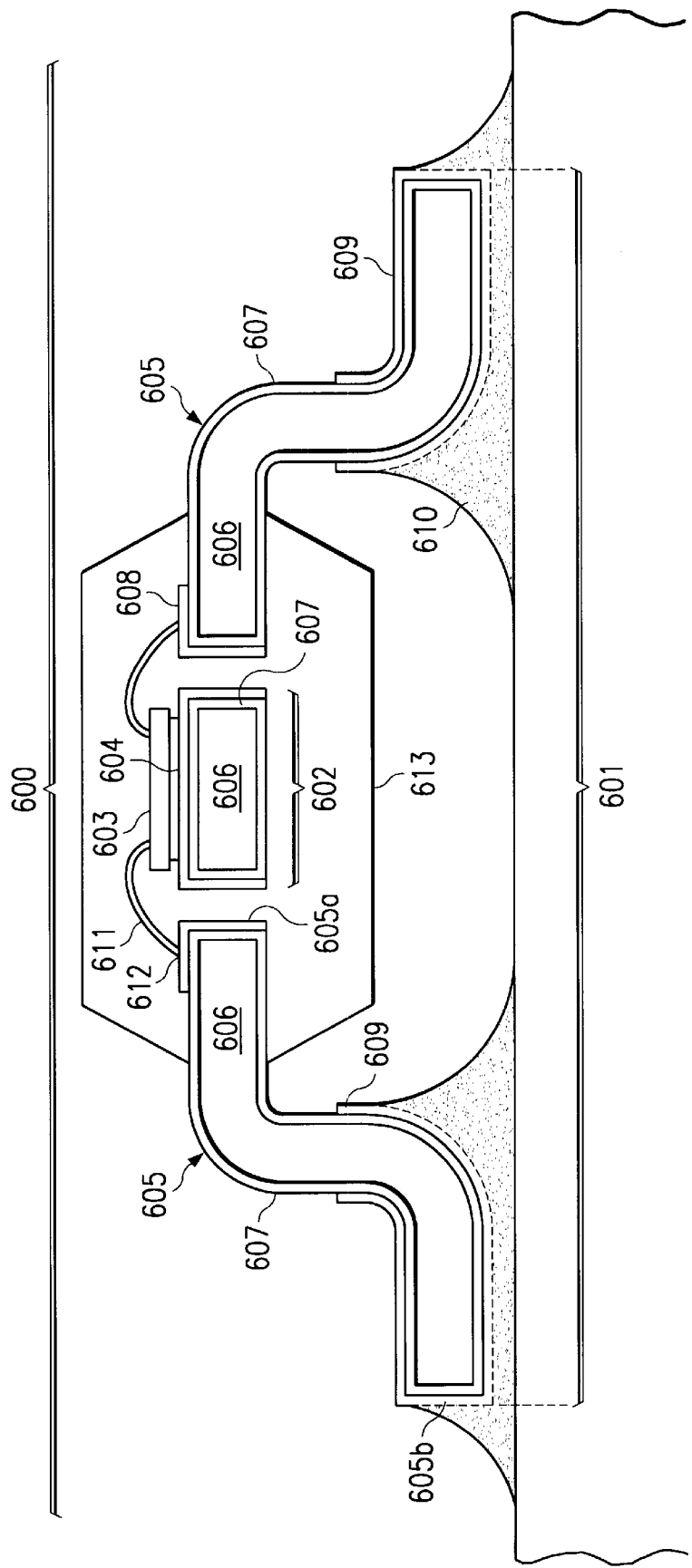

PALLADIUM-SPOT LEADFRAMES FOR SOLDER PLATED SEMICONDUCTOR DEVICES AND METHOD OF FABRICATION

This application claims priority under 35 USC §119 based upon Provisional Patent Application No. 60/138,070, filed Jun. 8, 1999.

FIELD OF THE INVENTION

The present invention is related in general to the field of semiconductor devices and processes and more specifically to the materials and fabrication of leadframes for integrated circuit devices.

DESCRIPTION OF THE RELATED ART

The leadframe for semiconductor devices was invented (U.S. Pat. Nos. 3,716,764 and 4,034,027) to serve several needs of semiconductor devices and their operation simultaneously: First of all, the leadframe provides a stable support pad for firmly positioning the semiconductor chip, usually an integrated circuit (IC) chip. Since the leadframe including the pads is made of electrically conductive material, the pad may be biased, when needed, to any electrical potential required by the network involving the semiconductor device, especially the ground potential.

Secondly, the leadframe offers a plurality of conductive segments to bring various electrical conductors into close proximity of the chip. The remaining gap between the ("inner") tip of the segments and the conductor pads on the IC surface are typically bridged by thin metallic wires, individually bonded to the IC contact pads and the leadframe segments. Obviously, the technique of wire bonding implies that reliable welds can be formed at the (inner) segment tips.

Thirdly, the ends of the lead segment remote from the IC chip ("outer" tips) need to be electrically and mechanically connected to "other parts" or the "outside world", for instance to assembly printed circuit boards. In the overwhelming majority of electronic applications, this attachment is performed by soldering. Obviously, the technique of soldering implies that reliable wetting and solder contact can be performed at the (outer) segment tips.

It has been common practice to manufacture single piece leadframes from thin (about 120 to 250 $\mu$m) sheets of metal. For reasons of easy manufacturing, the commonly selected starting metals are copper, copper alloys, iron-nickel alloys for instance the so-called "Alloy 42"), and invar. The desired shape of the leadframe is etched or stamped from the original sheet. In this manner, an individual segment of the leadframe takes the form of a thin metallic strip with its particular geometric shape determined by the design. For most purposes, the length of a typical segment is considerably longer than its width.

In the European patent # 0 335 608 B1, issued 14 June 1995 (Abbott, "Leadframe with Reduced Corrosion"), a palladium-plated leadframe is introduced which is not subject to corrosion due to galvanic potential forces aiding the migration of the base metal ions to the top surface where they will form corrosion products. The patent describes a sequence of layers consisting of nickel (over the base metal), palladium/nickel alloy, nickel, and palladium (outermost). This technology has been widely accepted by the semiconductor industry.

After assembly on the leadframe, most ICs are encapsulated, commonly by plastic material in a molding process. It is essential that the molding compound, usually an epoxy-based thermoset compound, has good adhesion to the leadframe and the device parts it encapsulates. Palladium, described above as the outermost layer of the leadframe, offers excellent adhesion to molding compounds.

Nickel/palladium plated leadframes are used because of their low total cost of ownership, primarily a result of eliminating post-mold solder plating. However, some customers, for instance automotive manufacturers and telephone central switching offices, require solder plated external leads, typically because of burn-in, accelerated testing or environmental conditions. Unfortunately, using a fully nickel/palladium plated leadframe precludes solder plating after molding because the tin in the solder reacts with the palladium to form a tin-palladium intermetallic that is not solderable.

If solder dipping is used after molding, the palladium will dissolve into the solder and the nickel is then solderable. However, solder dipping is not practical for devices with fine-pitch leadframes because of solder bridging. The typical solution to this dilemma is to use a silver spot-plated leadframe with post mold solder plating. In this process, solder is plated on the external leads which are either copper or nickel-plated copper. With small package geometries, there are tolerance limits with silver spot plating with negative effects on yield and cost.

An urgent need has therefore arisen for a low-cost, reliable mass production method for a leadframe combining the advantages of palladium with its bondability and adhesion capability to molding compounds, and the application flexibility of post-mold solder plated leads. The leadframe and its method of fabrication should be flexible enough to be applied for different semiconductor product families and a wide spectrum of design and assembly variations, and should achieve improvements toward the goals of improved process yields and device reliability. Preferably, these innovations should be accomplished using the installed equipment base so that no investment in new manufacturing machines is needed.

SUMMARY OF THE INVENTION

According to the present invention for a semiconductor integrated circuit (IC) leadframe, a base metal having a plated layer of nickel fully covering the base metal has a plated layer of palladium on the nickel layer selectively covering areas of the leadframe intended for bonding wire attachment. Further, a plated layer of solder on the nickel layer may selectively cover areas of the leadframe intended for parts attachment.

The present invention is related to high density ICs, especially those having high numbers of inputs/outputs, or contact pads, and also to devices in packages requiring surface mount in printed circuit board assembly. These ICs can be found in many semiconductor device families such as standard linear and logic products, digital signal processors, microprocessors, digital and analog devices, and both large and small area chip categories. The invention represents a significant cost reduction and enhances assembly flexibility of semiconductor packages, especially the plastic molded packages, compared to the conventional copper-based palladium-plated leadframes.

It is an aspect of the present invention to provide a technology for enabling either post-mold solder plated or solder preplated package leads, while maintaining a palladium layer in the localized areas intended for wire bonding with its significant cost advantage over the traditional silver spot plated inner leads.

Another aspect of the invention is to reach these goals with a low-cost manufacturing method without the cost of equipment changes and new capital investment, by using the installed fabrication equipment base.

Another aspect of the invention is to produce leadframes so that established wire bonding processes can continue unchanged, and that established board attachment process can continue unchanged.

Another aspect of the invention is to introduce a manufacturing quality check based on a simple, low-cost visual inspection. This check insures the selection of the correct leadframe before releasing it into the assembly process flow.

Another aspect of the invention is to eliminate silver and the cyanide solution used for its deposition from the leadframe manufacturing process flow, resulting in less costly waste treatment.

Another aspect of the invention is to introduce a palladium spot plating technology with provides loose tolerance for the spot boundaries, thus simplifying leadframe manufacturing and lowering fabrication cost.

These aspects have been achieved by the teachings of the invention concerning deposition and masking methods suitable for mass production. Various modifications of leadframe preparations have been successfully employed.

In the first embodiment of the invention, a plated layer of nickel is fully covering the leadframe base material; a layer of palladium is then plated onto the nickel layer so that it covers selectively the leadframe areas intended for bonding wire attachment.

In the second embodiment of the invention, a plated layer of solder is added onto the nickel layer so that it covers selectively leadframe areas intended for parts attachment, especially board assembly.

Leadframes prepared according to the invention can be successfully used in surface mount technologies based on bending the package lead segments.

The technical advances represented by the invention, as well as the aspects thereof, will become apparent from the following description of the preferred embodiments of the invention, when considered in conjunction with the accompanying drawings and the novel features set forth in the appended claims.

BRIEF DESCRIPTION OF THE DRAWINGS

FIG. 6 is a schematic and simplified cross sectional view of a packaged semiconductor device having a leadframe according to the invention, solder assembled on a substrate.

DETAILED DESCRIPTION OF THE PREFERRED EMBODIMENTS

Figure 1:
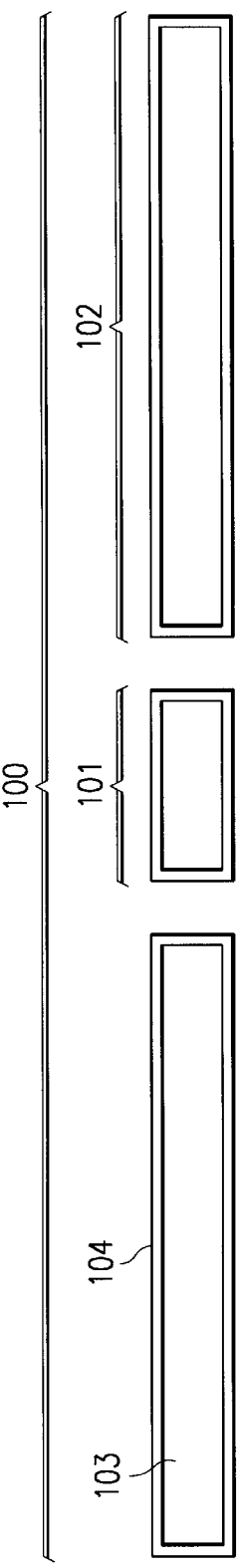
FIG. 1 is a schematic and simplified cross sectional view of a leadframe with base metal and first plated layer.

The present invention is related to the assembly of semiconductor ICs on leadframes, including wire bonding interconnection, and their final encapsulation, the sequential construction of these leadframes using deposited layers of various metals, and the process of fabricating these leadframes so that they offer quality-related visual inspection and reliable solder attachment to substrates.

The invention reduces the cost of leadframes while the leadframe functions are maximized. The invention best applies to any leadframe and any substrate used in semiconductor technology which exhibit the following design features: Usually, a chip mount pad for support of the IC chip surrounded by lead segments, each having a first end in proximity of the chip pad, and a second end remote from the chip pad. The invention thus applies to semiconductor package types such as PDIPs, SOICs, QFPs, SSOPs, TQFPs, TSSOPs and TVSOPs.

As defined herein, the starting material of the leadframe is called the "base metal", indicating the type of metal. Consequently, the term "base metal" is not to be construed in an electrochemical sense (as in opposition to 'noble metal') or in a structural sense. The base metal of leadframes is typically copper or copper alloys. Other choices comprise brass, aluminum, iron-nickel alloys ("Alloy 42"), and invar.

Leadframe segments have to satisfy five needs in semiconductor assembly:

1) Leadframes have to comprise segment ends remote from the chip mount pad ("outer segments") for solder attachment to other parts;
2) leadframes have to comprise segment ends near the chip mount pad ("inner segments") for bond attachments to wire interconnections;
3) leadframes have to comprise outer segments ductile for forming and bending the segments;
4) leadframe surfaces have to comprise adhesion to molding compounds; and
5) leadframe segments have to comprise insensitivity to corrosion.

According to the teachings of this invention, Need 1) is satisfied by depositing a layer of nickel, fully covering the leadframe base metal, and then either selectively preplating a layer of solder onto the nickel layer only onto those leadframe areas which are intended for parts attachment;

or plating a layer of solder onto the nickel layer after the encapsulation process (usually plastic molding) has been completed ("post-mold solder plating").

The invention satisfies Need 2) by first plating the nickel layer, fully covering the leadframe base metal as outlined above, and then plating a thin layer of palladium onto the nickel layer, selectively covering areas of the leadframe which are intended for bonding wire attachment (and chip attachment). For palladium, a thin layer is sufficient for reliable bonding wire attachment (stitch bonds, ball bonds, or wedge bonds).

The invention satisfies Need 3) by the selection of thickness and structure of the nickel layer employed to fulfill need 1). Thickness and deposition method of the nickel layer have to be selected such that the layer insures ductility and enables the bending and forming of the outer lead segments.

The invention satisfies Need 4) by the choice of the noble metal layer employed to fulfill need 2); a practical selection is palladium with its excellent adhesion to thermoset molding compounds and other encapsulation materials.

The invention satisfies Need 5) by the sequence of layers deposited over the copper base: Nickel and solder.

FIG. 1 is a schematic and simplified cross section of a leadframe portion, generally designated 100, and shows the chip mount pad 101 and a plurality of lead segments 102. The leadframe is made of a base metal 103 fully covered with a plated layer 104. The base metal usually is copper or copper alloy, but may also be aluminum, an iron-nickel alloy, or invar. The copper or copper alloy base sheet 103 has a preferred thickness in the range from 100 to 300 µm; thinner sheets are possible. The ductility in this thickness range provides the 5 to 15% elongation needed in the segment bending and forming operation. The leadframe is stamped or etched from the starting metal sheet. The plated nickel layer has a preferred thickness is the range from about 0.7 to 2.2 µm.

In the plating process, the stamped or etched leadframe is first immersed in an alkaline preclean solution at 20 to 90° C. for few seconds up to 3 minutes. Both alkaline soak cleaning and alkaline electrocleaning are employed. Oils, grease, soil, dirt and other contamination are thereby removed.

After rinsing, the leadframe is next immersed in an acid activation bath at room temperature for few seconds up to 5 minutes. The bath consists of a solution of sulfuric acid, hydrochloric acid, or other acid solution, preferably at about 30 to 60 g/l concentration. This solution removes copper oxide and leaves the metallic copper oxide surface in an activated state, ready to accept the deposition of metallic nickel.

Next, the leadframe is immersed in a first nickel plating solution to receive the deposition onto the copper base material of a nickel strike in the thickness range of about 0.02 to 0.13 µm. This first nickel layer fully encases the copper base metal and thus keeps the subsequent main nickel bath free from copper and copper compounds.

Next, the leadframe is immersed in a second nickel plating solution to receive the deposition onto the first nickel layer of an additional nickel layer in the thickness range of about 0.6 to 2.0 µm. The total thickness range of layer 104 is approximately 0.7 to 2.2 µm. This nickel layer has to be ductile for the leadframe segment bending and forming process. Further, the nickel surface has to be wettable in the soldering process, so that solder alloys or conductive adhesives can be used successfully.

Figure 2:
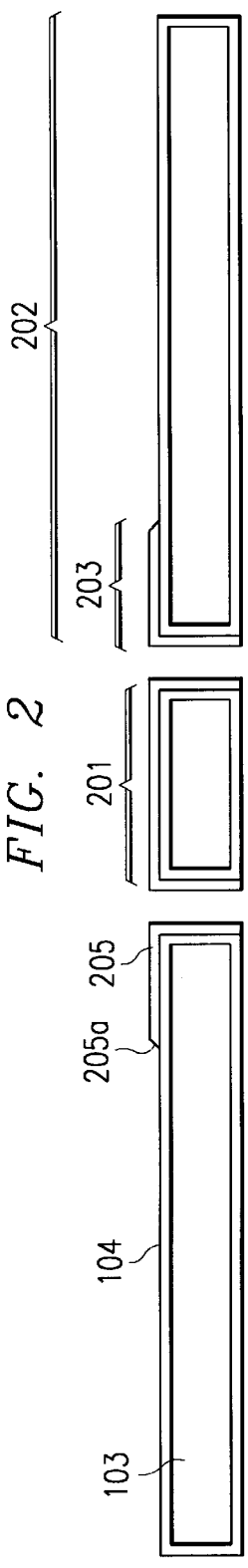
FIG. 2 is a schematic and simplified cross sectional view of a leadframe according to the first embodiment of the invention.

In the schematic cross section of a leadframe in FIG. 2, the first embodiment of the invention is shown. On the nickel layer 104, the next deposited layer 205 comprises an electroplated palladium layer in the thickness range of about 20 to 60 nm. Another choice as noble metal would be rhodium. The palladium thickness could possibly reduced to about 10 and 30 nm.

In this thickness range, palladium is suitable for all wire bonding attachments (stitch bonds, ball bonds, and wedge bonds) and retains its excellent adhesion to thermoplastic molding compounds—an attribute crucial for avoiding package delamination and progressive corrosion.

It is an important aspect of the present invention to deposit the palladium layer selectively onto the leadframe by using an inexpensive masking step. FIG. 2 illustrates that the palladium layer 205 covers the complete chip mount pad 201, but only the area portion 203 of the plurality of lead segments 202. Areas 203 are determined by the technical requirements of the intended bonding wire attachment. In the schematic example of FIG. 2, layer 205 terminates at boundary 205a. It is an advantage of the invention that boundary 205a may have loose tolerances.

Figure 3:
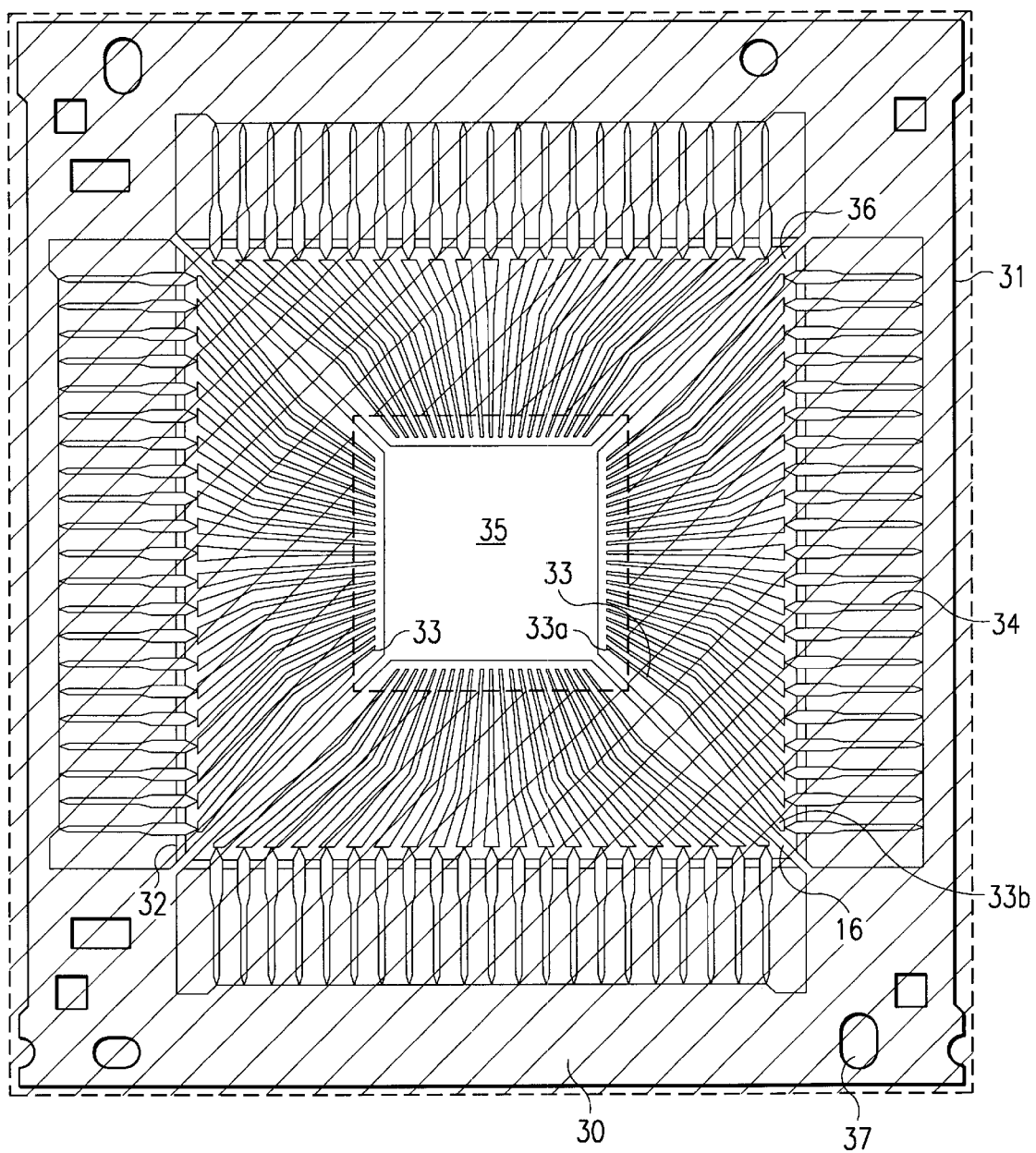
FIG. 3 is a simplified top view of a leadframe unit for semiconductor devices, delineating the masking needed in the fabrication method of the first embodiment of the invention.

The selective characteristic of the palladium deposition is achieved by a temporary masking step, which leaves only those leadframe portions exposed which are intended to receive the palladium layer. An example of the extent of such masking is depicted in FIG. 3, which shows a single leadframe unit from a continuous strip, for a typical semiconductor Quad Flat Pak device. The temporarily masked parts of the leadframe unit are shaded and the exposed parts are unshaded. The masked parts include carrier rails 30, outer leadframe 31 and dam bar 32, further portions of the plurality of lead segments 33.

As defined herein, each lead segment 33 has a first end 33a near the chip mount pad 35 and a second end 33b remote from chip mount pad 35. Further, each lead segment 33 has an external lead 34 attached to its second end 33b. In the example of FIG. 3, the leadframe unit has 84 lead segments 33, since it is designed for a plastic 84-lead Quad Flat Pak chip carrier.

Further, the temporarily masked portions of the leadframe include portions of the plurality of support members 36, which extend from carrier rail 30 toward chip mount pad 35. In the example of FIG. 3, the device has 4 support members 36. In summary, the exposed parts which receive the palladium plating, include the first ends 33a of lead segments 33 and the chip mount pad 35.

There are several methods to selectively deposit metals from solution onto a continuous strip. For high volume production of leadframes, continuous strip or reel-to-reel-plating is advantageous and common practice. Based on the loose tolerance acceptable for the boundaries of the palladium plating on the first ends of the lead segments, the preferred deposition method for the present invention is the so-called "wheel system". The process steps are as follows.

WHEEL SYSTEM

Material is moved over a large diameter wheel with apertures in it to allow solution flow to material;
apertures define the locations for plating;
index pins engage the pilot holes (designated 37 in FIG. 3) in the leadframe;
backing belt is used to hold material on wheel and mask backside of material;
anode is stationary inside wheel.

Advantages: Fast, material never stops for selective plating; no timing issues; pumps, rectifiers, and drive system are on continuously; low cost because system is mechanically uncomplicated.

Disadvantages: Loose plating boundaries, poor spot location, and potential bleedout are not critical issues for the present invention.

A more precise, but also more costly and slower selective plating technique is the step-and-repeat process.

STEP AND REPEAT

Leadframe material is stopped in selective plating head;
rubber mask system clamps on material;
plating solution is jetted at material;
current is applied;
current is shut off;
solution is shut off;
head opens;
material moves.

Advantages: Very sharp plating spot with excellent edge definition; very good spot location capability when used with index holes, pins and feedback vision system.

Disadvantages: Slow; material must stop during selective plating; expensive equipment to buy and maintain; timing issues; lots of moving parts.

Figure 4:
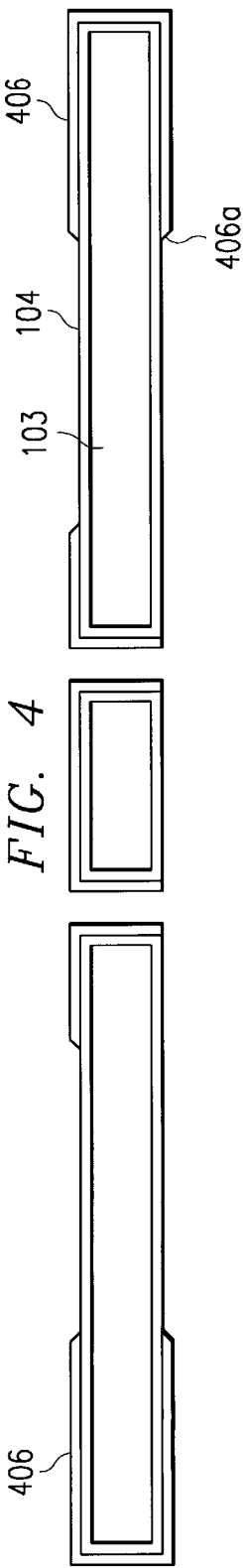
FIG. 4 is a schematic and simplified cross sectional view of a leadframe according to the second embodiment of the invention.

FIG. 4 depicts the second embodiment of the present invention. A layer 406 of solder is plated selectively onto the flood plated layer 104 of nickel over the leadframe base material 103. The solder plated portions cover the areas of the leadframe intended for board attach or other parts attachment, specifically the second ends of the lead segments, remote from the chip mount pad. The boundary of the solder plated portion is designated 406a in FIG. 4. The solder layer comprises materials selected from a group consisting of tin/lead, tin/indium, tin/silver, tin/bismuth, and conductive adhesive compounds. The solder layer has a reflow temperature compatible with wire bonding temperatures and molding temperatures. The solder layer has a thickness in the range from about 0.2 to 0.6 mm.

Figure 5:
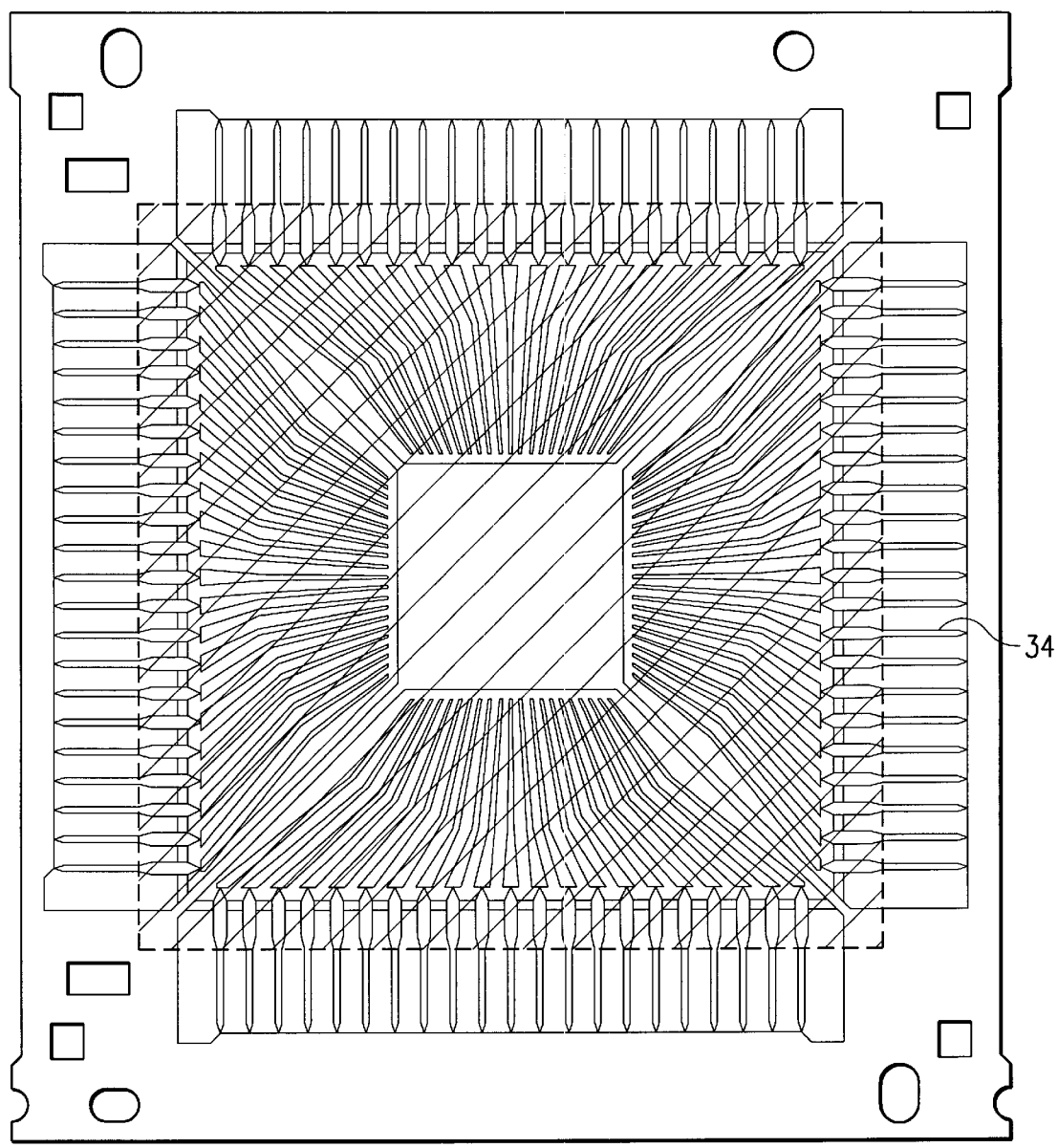
FIG. 5 is a simplified top view of a leadframe unit for semiconductor devices, delineating the additional masking needed in the fabrication method of the second embodiment of the invention.

The plating deposition process of the solder layer is analogous to the palladium process described in conjunction with FIGS. 2 and 3. However, the temporary plating mask has to be different. An example is depicted in FIG. 5, using an 84-lead QFP device analogous to FIG. 3. The mask (shaded area) covers all inner portions of the leadframe and only those portions of the external leads 34 exposed, which are intended for lead forming and board attach. Such formed leads are illustrated in FIG. 6.

In the schematic cross section of FIG. 6, the copper or copper alloy leadframe 601 of the invention is shown as applied in the assembly of a semiconductor package generally designated 600. Leadframe 601 has a chip mount pad 602 onto which an IC chip 603 is attached using adhesive material 604 (typically an epoxy or polyimide which has to undergo polymerization). Leadframe 601 further has a plurality of lead segments 605. These lead segments have a first end 605a near the chip mount pad 602 and their second end 605b remote from mount pad 602.

As shown in FIG. 6 schematically, leadframe 601 comprises base 606 made of copper or copper alloy. On the surface of this copper is a sequence of layers, described in detail in FIG. 4. Closest to the copper is a first layer 607 of nickel. This layer is followed by a spot-plated layer 608 of palladium, and a spot-plated layer 609 of solder. This solder layer 609 is incorporated into the meniscus of the bulk solder 610 in the process of surface mounting device 600 onto a substrate or board.

In FIG. 6, bonding wires 611 have stitches 612 welded to the palladium surface 608 of the first ends 605a of leadframe segments 605. The bonding wires are selected from a group consisting of gold, copper, aluminum, and alloys thereof. Any of these metals provide reliable welds to the layered leadframes of the invention.

As shown in FIG. 6, the second ends 605b of segments 605 are suitable for bending and forming due to the ductility of the copper base and the plated nickel layer. Using this malleable characteristic, segments 605 may be formed in any shape required for surface mounting or any other technique of board attach of the semiconductor devices. The bending of the segments does not diminish the corrosion protection of the second segment ends 605b. For example, FIG. 6 indicates a so-called "gull wing shape" of segments 605. This shape is widely used for IC packages in the so-called "small outline" configuration, as illustrated in FIG. 6.

The solder spot-plated copper leadframe of the invention provides for easy and reliable solder attachment to boards or other parts of the formed leadframe segments. In FIG. 6, solder attach material 610 comprises materials selected from a group consisting of tin/lead mixture, tin/indium, tin/silver, tin/bismuth, and conductive adhesive compounds. All of these materials show good wetting characteristics to the plated nickel surface of the copper leadframes.

In FIG. 6, molding compound 613 encapsulates the mounted chip 603, bonding wires 611 and the first ends 605a of the lead segments 605. The second, remote ends 605b of the segments are not included in the molded package; they remain exposed for solder attachment. Typically, the encapsulation material 613 is selected from a group consisting of epoxy-based molding compounds suitable for adhesion to the leadframe surfaces. For palladium, excellent adhesion characteristics to molding compounds can be achieved, preventing package delamination, moisture ingress and corrosion.

The present invention provides a very important modification of the solder plating process. The invention offers the opportunity to apply the conventional method of solder plating the outer leads while the leadframe is still in its original strip form. This means the solder plating step is performed after completing the encapsulation molding step, but before the steps of singulating the devices ("trimming") from the leadframe strip and bending ("forming") the leads. This low-cost method of solder plating is technically well established and produces excellent quality of solder ceovered outer leads, suitable for subsequent bending.

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description. As an example, the material of the semiconductor chip may comprise silicon, silicon germanium, gallium arsenide, or any other semiconductor material used in manufacturing. As another example, the design, cover area and fabrication method of the palladium layer may be modified to suit specific leadframe or substrate needs. It is therefore intended that the appended claims encompass any such modifications or embodiments.

I claim:

1. A leadframe for use with integrated circuit chips comprising:
    a base metal having a plated layer of nickel fully covering said base metal; and
    a plated layer of palladium on said nickel layer, selectively covering areas of said leadframe for bonding wire attachment.

2. The leadframe according to claim 1 wherein said base metal copper, copper alloy, aluminum, iron-nickel alloy, or invar.

3. The leadframe according to claim 1 wherein said nickel layer has a thickness in the range from about 0.7 to 2.2 µm.

4. The leadframe according to claim 1 wherein said palladium layer has a thickness in the range from about 20 to 60 nm.

5. A leadframe for use with integrated circuit chips, having a chip mount pad and a plurality of lead segments, each having a first end near said mount pad and a second end remote from said mount pad, comprising:
    a leadframe base made of copper or copper alloy;
    a layer of nickel deposited onto said copper or copper alloy; and
    a layer of palladium on said nickel layer, selectively deposited onto said first end of said lead segments.

6. The leadframe according to claim 5 wherein said palladium layer covers selective areas having boundaries of loose tolerance.

7. The leadframe according to claim 5 wherein said copper or copper alloy base has a thickness between about 100 and 250 µm.

8. A leadframe for use with integrated circuit chips comprising:
    a base metal having a plated layer of nickel fully covering said base metal;

a plated layer of palladium on said nickel layer, selectively covering areas of said leadframe intended for bonding wire attachment; and a plated layer of solder on said nickel layer, selectively covering areas of said leadframe for parts attachment.

9. The leadframe according to claim 8 wherein said solder layer comprises materials selected from a group consisting of tin/lead, tin/indium, tin/silver, tin/bismuth, and conductive adhesive compounds.

10. The leadframe according to claim 8 wherein said solder layer has a thickness in the range from about 0.2 to 0.6 mm.

11. The leadframe according to claim 8 wherein said solder layer has a reflow temperature compatible with wire bonding temperatures and molding temperatures.

12. A semiconductor device comprising:

a leadframe comprising a chip mount pad for an integrated circuit chip and a plurality of lead segments, each having a first end near said mount pad and a second end remote from said mount pad;

said leadframe having a surface layer of nickel;

said leadframe further having a layer of palladium on said nickel layer, selectively covering said first ends of said lead segments in a thickness suitable for bonding wire attachment;

an integrated circuit chip attached to said mount pad;

bonding wires interconnecting said chip and said first ends of said lead segments;

encapsulation material surrounding said chip, bonding wires and said first ends of said lead segments, while leaving said second ends of said lead segments exposed; and a layer of solder on said nickel layer, selectively covering said second ends of said lead segments in a thickness suitable for parts attachment.

13. The device according to claim 12 wherein said bonding wires are selected from a group consisting of gold, copper, aluminum and alloys thereof.

14. The device according to claim 12 wherein the bonding wire contacts to said first ends of said lead segments comprise welds made by ball bonds, stitch bonds or wedge bonds.

15. The device according to claim 12 wherein said encapsulation material is selected from a group consisting of epoxy-based molding compounds suitable for adhesion to said leadframe.

16. The device according to claim 12 further comprising lead segments having said second ends bent, whereby said segments obtain a form suitable for solder attachment.

* * * * *